United States Patent
Hopper et al.

(10) Patent No.: US 6,586,302 B1
(45) Date of Patent: Jul. 1, 2003

(54) METHOD OF USING TRENCHING TECHNIQUES TO MAKE A TRANSISTOR WITH A FLOATING GATE

(75) Inventors: Peter J. Hopper, San Jose, CA (US); Yuri Mirgorodski, San Jose, CA (US); Chin Miin Shyu, San Jose, CA (US); David Tsuei, Sunnyvale, CA (US); Peter Johnson, Sunnyvale, CA (US); Alexander H. Owens, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/931,477

(22) Filed: Aug. 16, 2001

(51) Int. Cl.$^7$ .............................................. H01L 21/336
(52) U.S. Cl. ...................... 438/257; 438/258; 438/260; 438/261; 438/262; 438/263; 438/264; 438/593; 438/594
(58) Field of Search ................................. 438/257, 258, 438/260, 261, 262, 263, 264, 593, 594

(56) References Cited

U.S. PATENT DOCUMENTS

| | | |
|---|---|---|
| 4,203,158 A | 5/1980 | Frohman-Bentchkowsky et al. ........................... 365/185 |
| 5,029,130 A | 7/1991 | Yeh ............................. 365/185 |
| 5,045,488 A | 9/1991 | Yeh .............................. 437/43 |
| 5,067,108 A | 11/1991 | Jenq ............................ 365/185 |
| 5,242,848 A | 9/1993 | Yeh .............................. 437/43 |
| 5,278,087 A | 1/1994 | Jenq ............................. 437/43 |
| 6,090,668 A * | 7/2000 | Lin et al. ...................... 438/266 |
| 6,294,429 B1 * | 9/2001 | Lam et al. ..................... 438/260 |
| 6,300,196 B1 * | 10/2001 | Chang .......................... 438/257 |
| 6,358,797 B1 * | 3/2002 | Tseng ........................... 438/257 |
| 2002/0064910 A1 * | 5/2002 | Chen et al. .................. 438/201 |

OTHER PUBLICATIONS

Technical Paper, "SuperFlash EEPROM Technology," by *Silicon Storage Technology, Inc.*, revised Mar. 1999, 3 pages in length.

Technical Paper, "Technical Comparison of Floating Gate Reprogrammable Nonvolatile Memories," by *Silicon Storage Technology, Inc.*, revised Mar. 1999, 7 pages in length.

* cited by examiner

*Primary Examiner*—Amir Zarabian
*Assistant Examiner*—Jeff Vockrodt
(74) *Attorney, Agent, or Firm*—Stallman & Pollock LLP

(57) ABSTRACT

A method for making an electrically programmable and erasable memory cell is disclosed. Specifically, a method for creating a floating gate using shallow trench isolation-type techniques is utilized to provide a floating gate having sharply defined tip characteristics. A first insulating layer is formed over a substrate. A conductive material is formed over the first insulating layer. A trench is defined in the conductive layer. This trench is filled with an oxide which is used as a mask to define tips of the floating gate during an etching process which defines the edges of the floating gate. After the floating gate has been etched, a tunneling oxide deposited over the floating gate. A conductive material is then formed over the tunneling oxide.

8 Claims, 9 Drawing Sheets

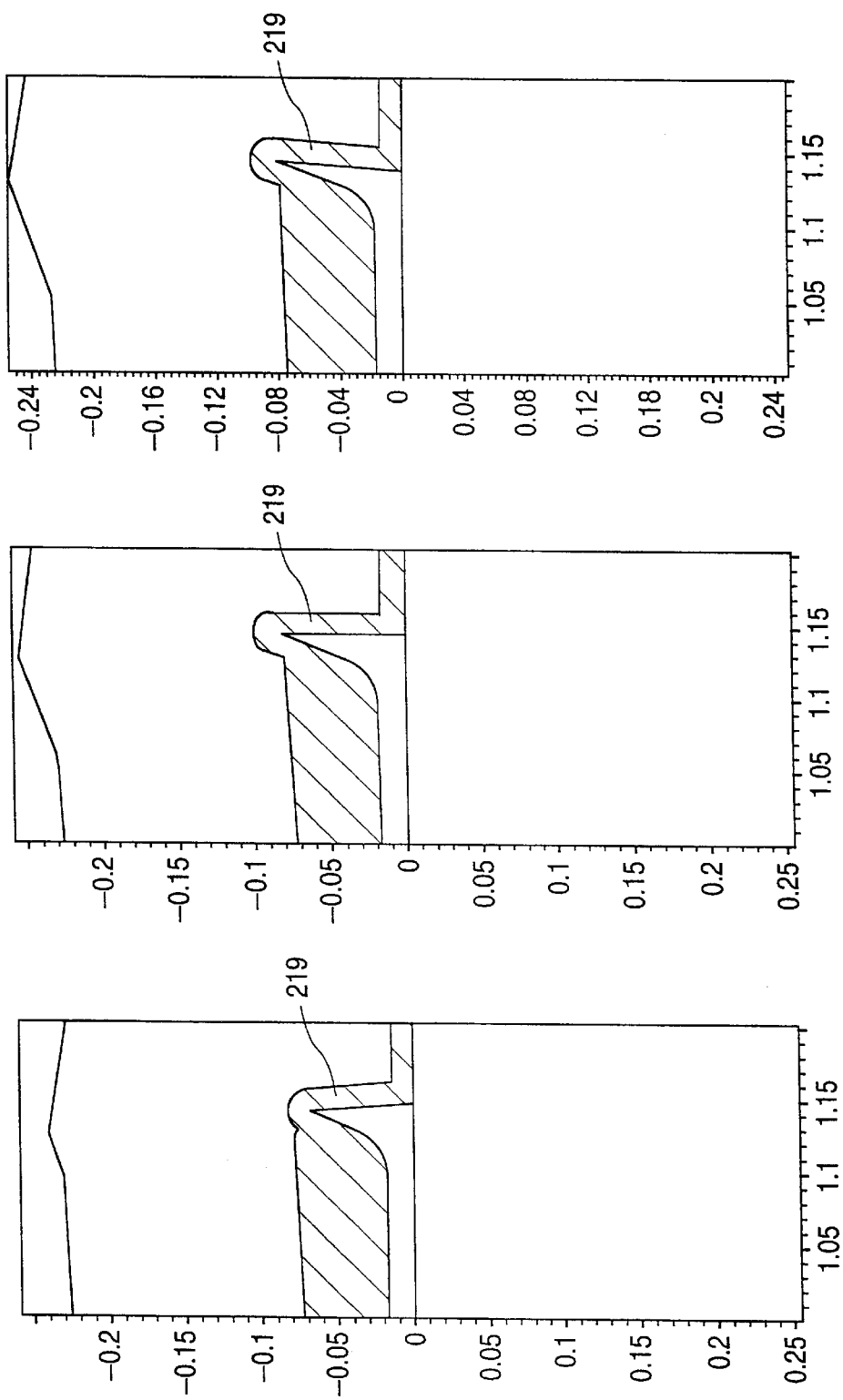

METHOD OF USING TRENCHING TECHNIQUES TO MAKE A TRANSISTOR WITH A FLOATING GATE

TECHNICAL FIELD

The present invention relates to a method of using trenching techniques to fabricate a transistor having a floating gate.

BACKGROUND OF THE INVENTION

Non-volatile reprogrammable semiconductor memory devices which utilize a floating gate are well known in the art. One such type of semiconductor memory device is shown in U.S. Pat. Nos. 5,029,130; 5,045,488; 5,067,108; 5,242,848; and 5,278,087. These patents are incorporated herein by reference. These patents disclose a structure for a programmable and erasable memory cell that utilizes a single transistor, which is often referred to as a "split gate" cell.

FIG. 1 shows a cross sectional view of the split gate memory cell of the prior art. The operation of this semiconductor device 50 is discussed in detail in the patents referred to above. A general summary of the structure of the split gate cell 50 is provided as follows. Source region 106 and drain region 102 are disposed in a semiconductor substrate 20. The drain region 102 is formed adjacent to the one edge of the control gate 100. The source region 106 is formed to have at least a portion of the region beneath the floating gate 108. The floating gate 108 is positioned underneath a portion of the control gate 100. A dielectric material is disposed between the floating gate 108, the control gate 100, and the substrate 20.

As is well known, the memory cell device can be operated in three modes: erase, program, and read. In the erase mode, a positive erase voltage is applied to the control gate 100. Depending on the design of the device 50, the range of the erase voltage can vary. Typically, an erase voltage in the range of 10 volts is utilized. The source 106 and the drain 102 are then brought to ground. The floating gate 108 is thereby capacitively coupled with the source 106, which results in the voltage of the floating gate 108 initially being very close to that of the source 106, which is significantly less than the erase voltage applied to the control gate 100. As a result of the potential difference between the floating gate 108 and the control gate 100, electrons on the floating gate 108 will move through a dielectric material to the control gate 100 by the mechanism of Fowler-Nordheim tunneling. This tunneling occurs due to the locally enhanced field on the surface of the floating gate, and particularly at the tip of the floating gate 110. Due to the shape of the floating gate and the thickness of the oxide between the floating gate and the control gate, electrons will tunnel vertically from the tip 110 of the floating gate to the control gate proximate to the tip of the floating gate. After the erase operation has been completed, the floating gate 108 will have a net positive charge, or at minimum will be neutral (non-negative), because many electrons will have moved from the floating gate 108 to the control gate 100.

The cell 50 is programmed as follows. A programming voltage in the range of approximately 10 volts is applied to the source 106. The voltage applied to the drain 102 is in the range of approximately 1 volt, and the voltage applied to the control gate 100 is in the range of approximately 2 volts. This creates an electric field which causes current to move through the channel 104. Specifically, electrons will move from the drain 102 toward the source 106. The voltage in the area 112 of the channel 104 beneath the control gate 100 will be relatively small. In the area 114 of the channel 104 beneath the floating gate 108, however, there will be a steep increase in voltage. This is due to the fact that there is strong capacitive coupling between the source 106 and the floating gate 108. This capacitive coupling results in the potential of the floating gate 108 initially being relatively close to the potential of the source 106. As a result of this steep increase in potential between the region 112 of the channel 104 under the control gate 100, and the region 114 of the channel 104 under the floating gate 108, hot electrons are generated some of which will move from the channel 104 onto the floating gate 108. Thus, after programming, the floating gate 108 will have a net negative charge as a result of the hot electrons which have moved onto the floating gate 108, thereby identifying the cell 50 as "programmed".

To read the cell 50, a voltage in the range of approximately 1 volt is applied to the drain 102, the source 106 is in the range of approximately 0 volts, or ground, and the control gate 100 is brought in the range of approximately two volts. If the floating gate 108 has a net negative charge as a result of being programmed, than the channel region 114 under the floating gate 108 will be closed and current will not result from the read voltages. If, however, the floating gate 108 has a positive charge, or is neutral, due to the device having been erased, then the region 114 of the channel 104 beneath the floating gate 108 will be opened and current will result. Thus, current flow, or lack of current flow, can be viewed as a binary distinction between memory cells.

This type of memory cell is appropriate for use in a memory device having an array of memory cells, and having circuitry to provide conventional row and column addressing as discussed in the above referenced patents.

As is apparent from the above provided review of the operation of the split gate cell 50, the shape of the floating gate 108, and particularly the tips 110 of the floating gate which project toward the control gate, is crucial for promoting efficient tunneling of electrons from the floating gate to the control gate. Specifically, the floating gate tip is used as an electric field enhancing point to assist in Fowler-Nordheim current tunneling, as will be discussed in more detail below. As discussed in the above-referenced patents, a polysilicon oxidation process (LOCOS) can be used to create the tips of the floating gate. The polysilicon LOCOS derived tip, has inherent difficulties associated with it however, specifically in its manufacturability. The poly grain structure and LOCOS birds beak are examples of the causes of its variability. The LOCOS derived tip varies in both radius of curvature, tip angle and distance the tip penetrates into the overlying tunneling oxide. These attributes of the floating gate tip can effect the overall operation of the device.

What is needed is a repeatable and consistent process for making a floating gate. The present invention proposes the use of a STI (shallow trench isolation) type of process to create a floating gate tip. This process leads to enhanced tip profile stability and control.

SUMMARY

The present invention is directed to a method for making a split gate memory cell. In one embodiment the method for producing the memory cell includes depositing a first layer of conductive material above a substrate. Then a trench is created in the first layer of conductive material. After creating the trench, a thermal oxide layer is formed in the trench, and another layer of oxide is deposited over the thermal oxide layer. The oxide in the trench is then used as a mask during an etching process that etches the first layer of conductive material to form a floating gate. After the floating gate has been formed a layer of tunneling oxide is formed over the floating gate. A second layer of conductive material is then deposited over tunneling oxide. This layer of conductive material is then etched to form a control gate.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE DRAWINGS

Figure 2A:
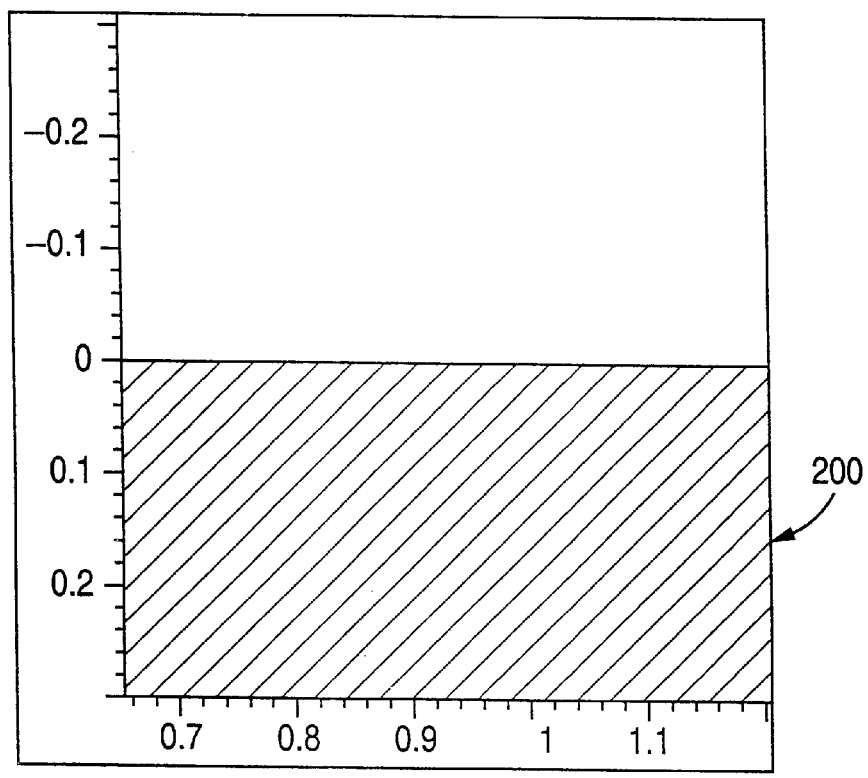
FIGS. 2 (a–l) shows a method of the invention for forming a floating gate.

FIG. 2(a) shows a silicon substrate 200 which can be used as a starting point for forming a split gate cell using a method of the present invention. The starting material can be a P-type silicon substrate with a doping level ranging from 5 to 50 ohms depending on the level of scaling for the device. As is known in the art, there could also be a wide range of other variations as starting points for the substrate. The dimensions on the side and bottom of the FIG. 2(a), and them subsequent FIGS. 2(b)–3(f), are in microns. One of skill in the art will recognize that the dimensions of the device can be varied depending on the scaling of the device.

Figure 2B:
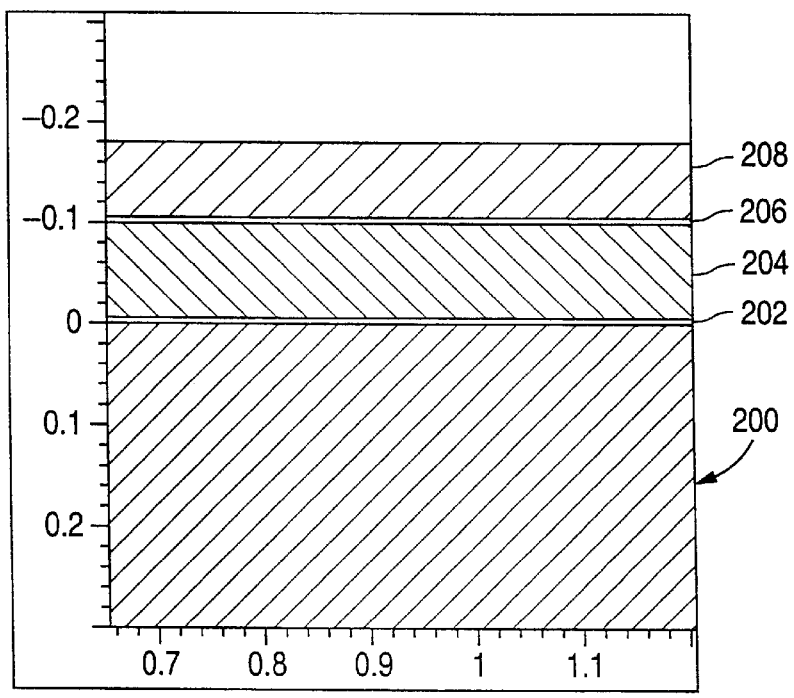

FIG. 2(b) shows the substrate 200 covered with an insulating dielectric material 202. This dielectric material 202 can be a thermal oxide which is grown on the substrate 200. A number of materials can be used to form this insulating dielectric layer 202, such as silicon oxynitride, silicon oxide, or silicon nitride. The thickness of this dielectric layer 202 can be in the range from approximately 50 to 200 angstroms.

The dielectric material 202 is covered with a polysilicon layer 204. It is also possible to use materials other than polysilicon, such as polygermanium or other suitable conductive material to cover the insulating layer 202. In one embodiment, the polysilicon 204 is deposited by a chemical vapor deposition process (CVD). As one skilled in the art will realize, other deposition techniques may also be appropriate. The thickness of the polysilicon can be in the range of 1000 to 2500 angstroms.

A thin padding layer of silicon oxide 206 can optionally be formed on the upper surface of the polysilicon 204. A silicon nitride layer 208 covers the padding oxide layer 206. The nitride layer can be formed using a CVD process. The layer 208 could also be created using other hard mask materials capable of being formed on the oxide layer 206, using techniques such as a CVD process, or spinning a liquid form onto the surface of 206. As one skilled in the art will recognize, other techniques such as using plasma in part and CVD in part, or sputtering on as a hard mask shell are also be possible.

Once the nitride layer 208 has been formed, a pattern is applied to the nitride layer 208 using normal photolithographic methods. Once the pattern has been applied to the nitride, the pattern is used to etch a trench 209 into the polysilicon layer 204, as shown in FIG. 2 (c). The etch is primarily isotropic in nature. However, as discussed in greater detail below, the isotropic nature of the etch can be controlled to effect the shape of the inner sidewall 210 of the tip 211 of the floating gate.

The tip 211 of the floating gate is shown in FIG. 2 (i). As discussed above in connection with the operation of the split gate cell, the tip of a floating gate operates to facilitate the tunneling of electrons from a floating gate to the a control gate during the erase mode of a split gate cell. As will be discussed in more detail below it is important to be able to control the shape of the tip 211 of the floating gate.

Figure 2C:
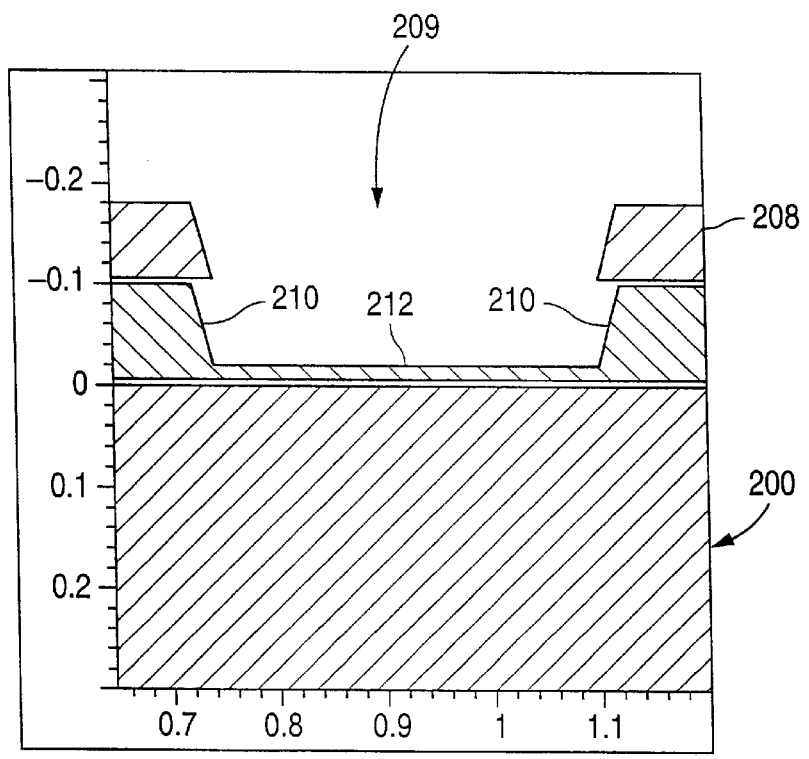

FIG. 2(c) illustrates the effect of the isotropic etching, and shows that the angle of the tip is ultimately determined by the angle of the inner sidewall 210 of the trench. The angle of the inner sidewall 210 is determined by the isotropic etching which can be controlled using a number of etching parameters, such as the composition of the gases used during the etching process, the chemistry of the etcher, the pressure used during the etching process, the DC bias of the cathode for the etcher and the power of the etcher. Using known techniques for controlling isotropic etching by varying these parameters, one can precisely control the angle of the inner sidewall 210 of the floating gate tip.

The depth of the trench 209 etched into the polysilicon layer 204 is determined in part by the overall thickness of the polysilicon layer. Generally, the thickness of the polysilicon layer 204 at the bottom 212 of the trench 209 should be of a thickness in the range of approximately 200 to 300 angstroms. Consequently, the total depth of the trench 209 should be the total thickness of the polysilicon layer 204 (typically 500 to 2000 angstroms) minus 200 or 300 angstroms.

Not maintaining enough thickness between the bottom 212 of the trench 209 and the top of the insulating layer 202 can result in depletion of the polysilicon layer 204 between the trench bottom 212 and the top surface of the substrate 200. If the polysilicon thickness is too thin, this will result in overall degradation of performance. For example, during the erase mode, a voltage of approximately 10 volts can be applied across the tip which would result in depleting the polysilicon layer, which in turn would reduce the voltage potential at the tip.

Figure 2D:
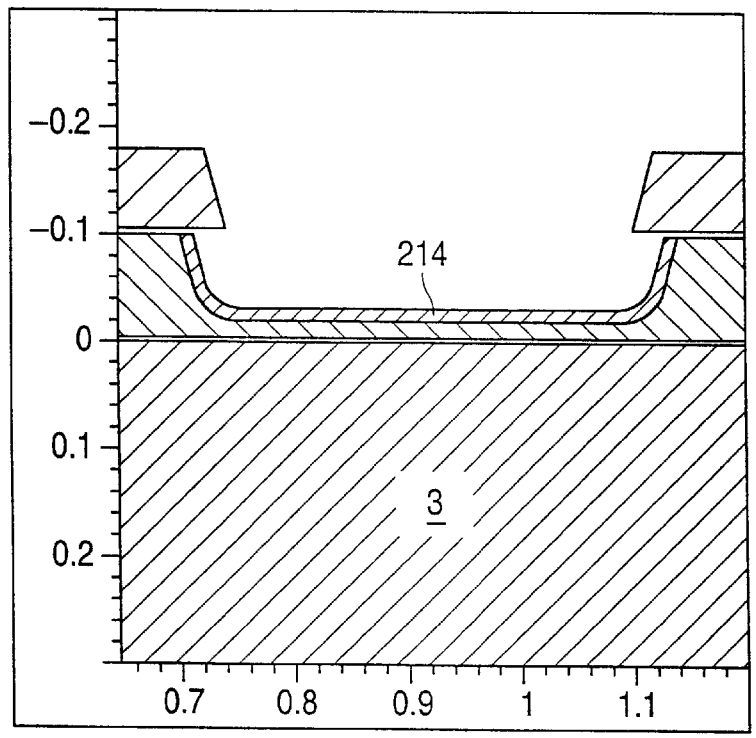

FIG. 2(d) shows a first step in the formation of an oxide layer on the side walls of the trench 209. In one embodiment, the forming of this oxide layer is a two-step process. The first step is forming a liner oxidation layer 214. This liner oxidation layer is formed to clean up the state of the polysilicon 204 along the edges of the trench 209. This process can be used to help smooth over some of the damage that is caused to the polysilicon surface during the etching step which is used to create the trench 209. The liner oxidation layer 214 is a very thin oxidation layer on the order of approximately 50 to 500 angstroms thick, depending on the scaling of the device. The liner oxide 214 is formed using a thermal oxidation process.

Figure 2E:
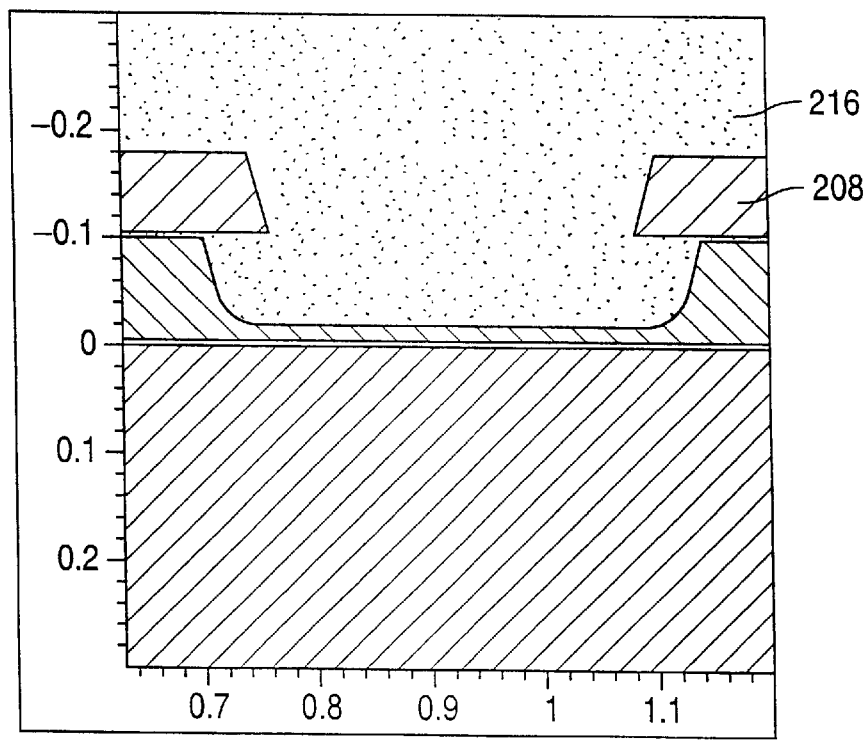
Figure 2F:
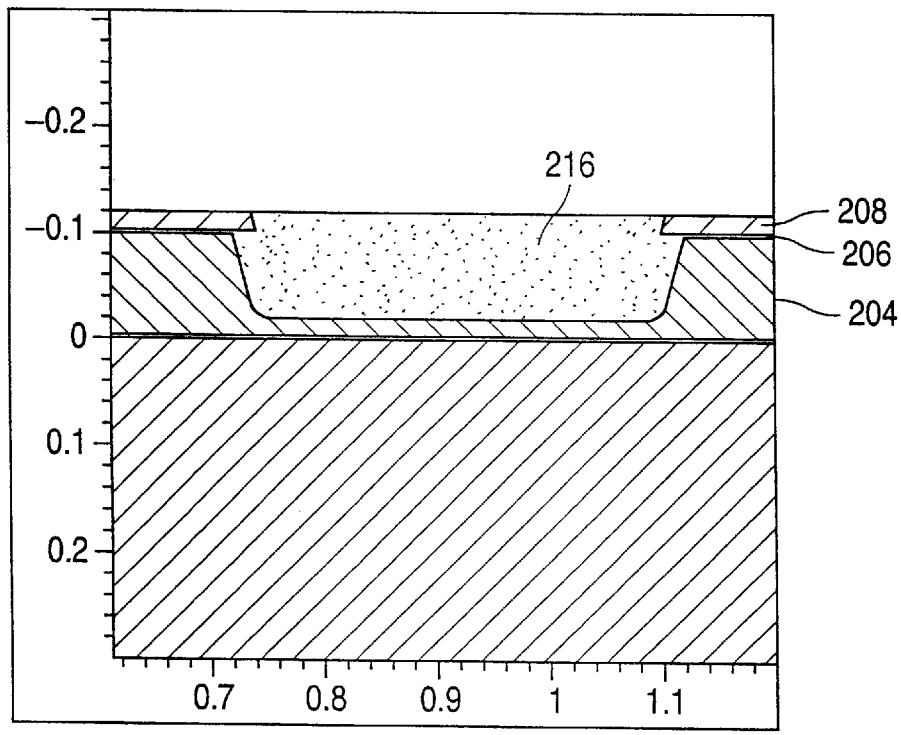
Figure 2G:
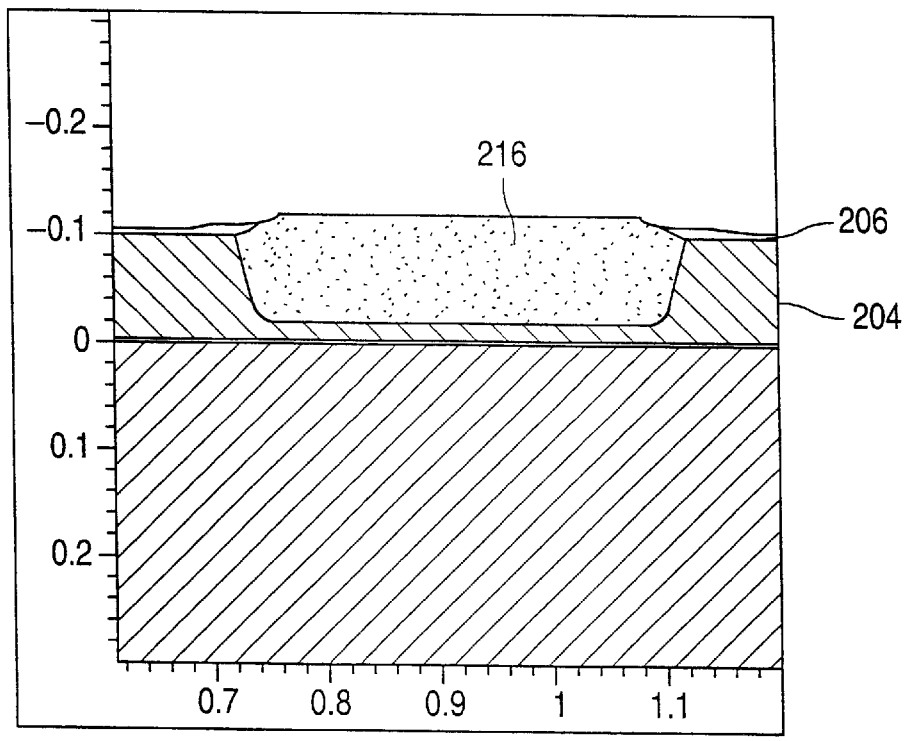
Figure 2H:
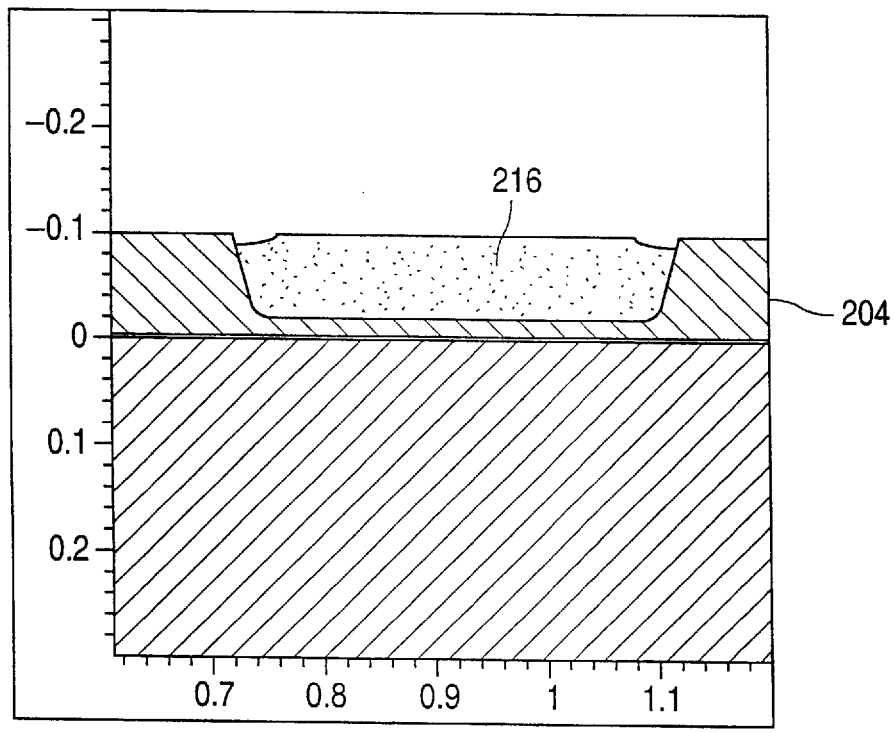
Figure 2I:
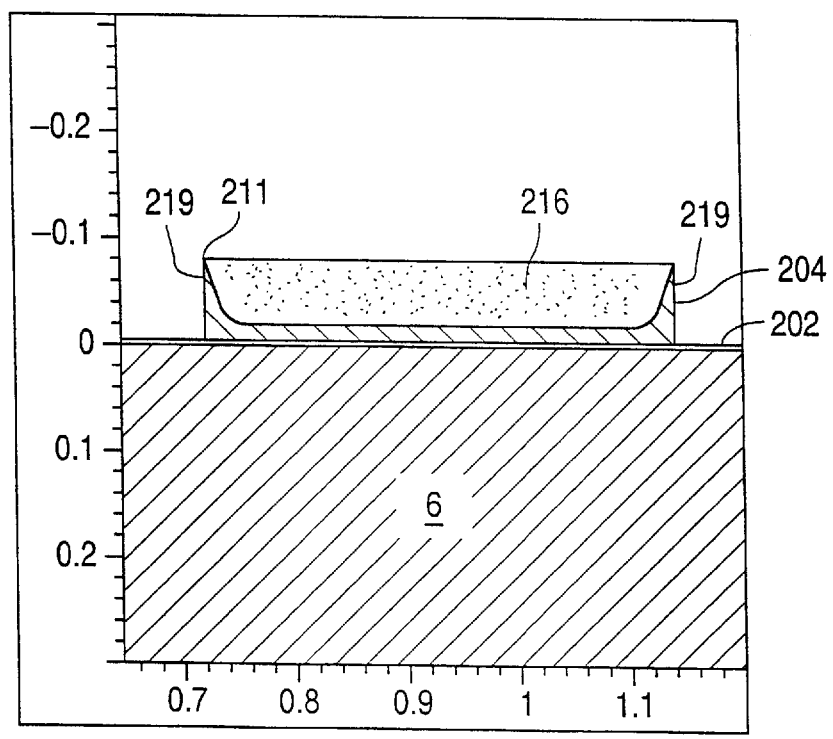

FIG. 2(e) shows the next step in the process. A second layer of oxide 216 is formed to completely fill the trench 209, as well as to cover the surface of the nitride layer 208, using a CVD process. After the CVD process has been used to apply the oxide 216, the next step is to use a chemical mechanical polishing (CMP) technique to polish off the upper layer of the oxide 216, and the nitride 208 as shown in FIG. 2(f). At this point, a hot phosphoric acid can be used to remove the remaining nitride 208, which is then followed with an oxide cleaning step which removes the oxide pad layer 206. The result of removing the nitride layer is shown in FIG. 2(g). The result of an oxide clean step is shown in FIG. 2(h). The pad oxide removal step can be done with a wet dip of hydrofluoric acid.

The next step is to etch the polysilicon 204. For this step, the oxide layer 216 formed in the trench 209 is used as a hard mask to protect the polysilicon layer 204 which will form the floating gate. This etching step is a largely an anisotropic etch. During this etching process, the oxide layer 202 formed on the surface of the substrate is used as an etch stop layer for the etching process. It is important to note that that anisotropic etch can be controlled using the techniques discussed above to introduce some degree of etching in the lateral direction. In this way, the shape of the tip of the floating gate can be varied such that the outer sidewall 219 of the tip is not entirely perpendicular relative to the substrate surface.

Figure 2J:
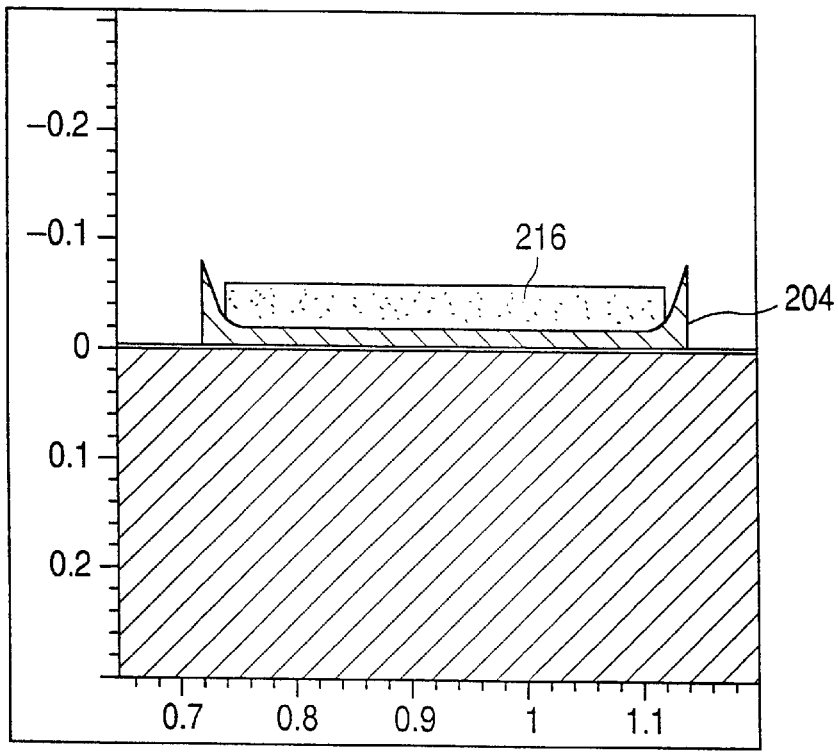

The formation of the floating gate tip can be further enhanced after the above etching step, by removing an additional amount of the oxide layer 216 formed within the trench. A wet oxide etching process can be used to remove a portion of the oxide layer 216 as shown in FIG. 2(j).

Figure 2K:
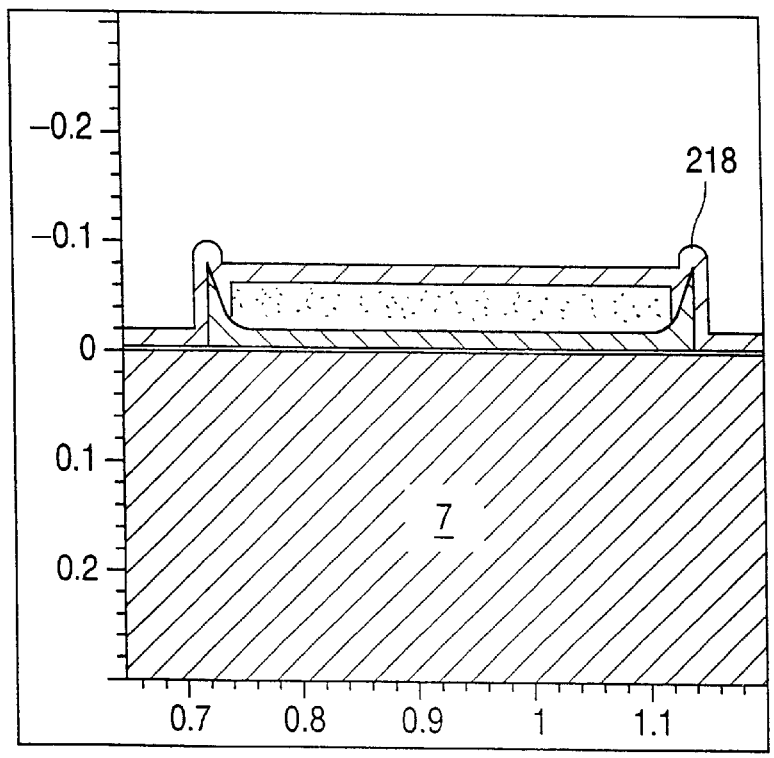
Figure 2I:
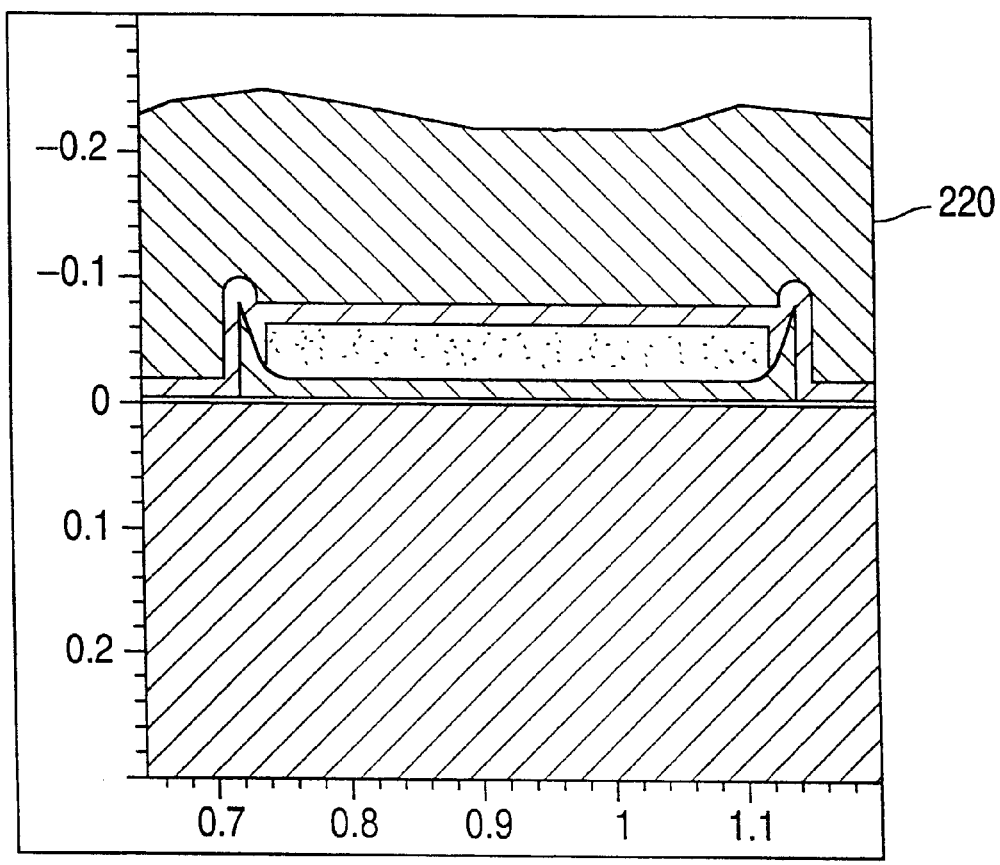

Referring to FIG. 2(k), once the polysilicon has been etched to form the floating gate shape, a tunneling oxide layer is formed using a CVD process. It advantageous to use a low temperature CVD process as opposed to a thermal oxide step. A thermal oxide step may round the tips which could diminish the overall performance of the floating gate and, in turn, the overall operation of the device.

Figure 1:
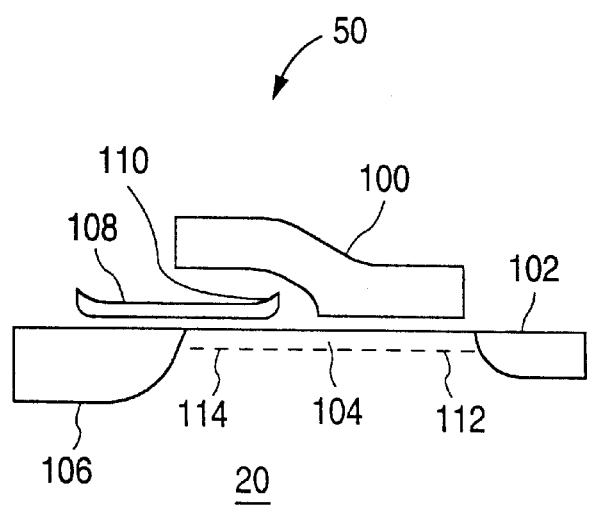
FIG. 1 shows a cross sectional view of the split gate transistor of the prior art.

After the tunneling oxide layer 218 has been formed, a layer of polysilicon or other conductive material 220 is formed over the tunneling oxide. This polysilicon 220 is typically applied using a CVD process, and is shown in FIG. 2(l). The polysilicon 220 can be etched to form the control gate as shown in FIG. 1 using standard photolithographic and etching techniques. The source and drain regions as shown in FIG. 1 can also be created using conventional techniques.

Figure 3F:
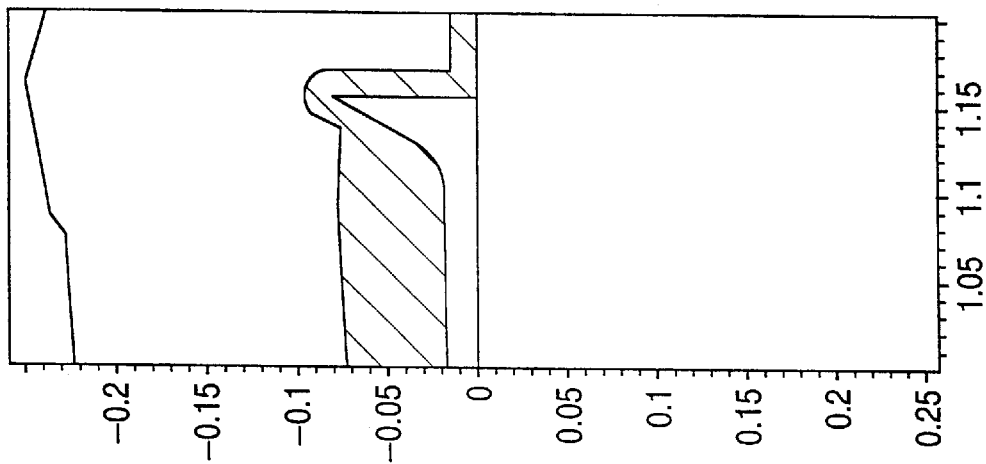
FIGS. 3 (a–f) show cross sectional views of different embodiments of a floating gate tip.
Figure 3E:
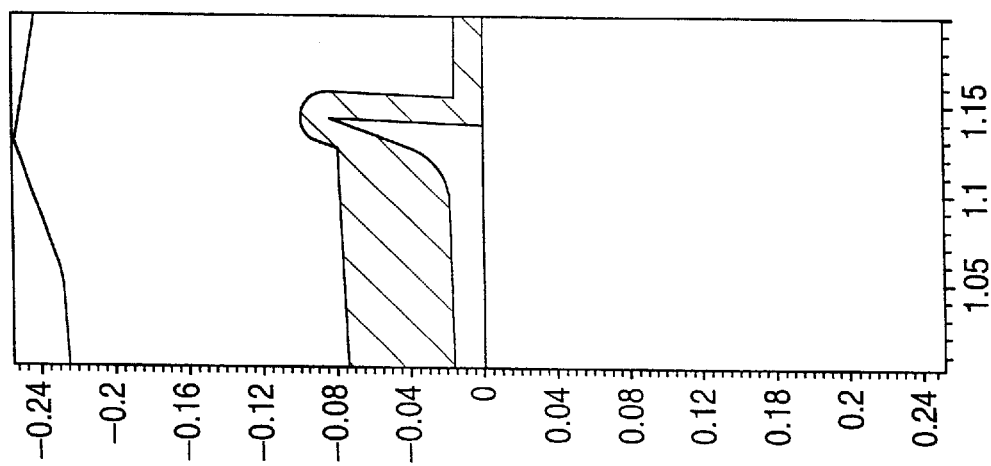
Figure 3D:
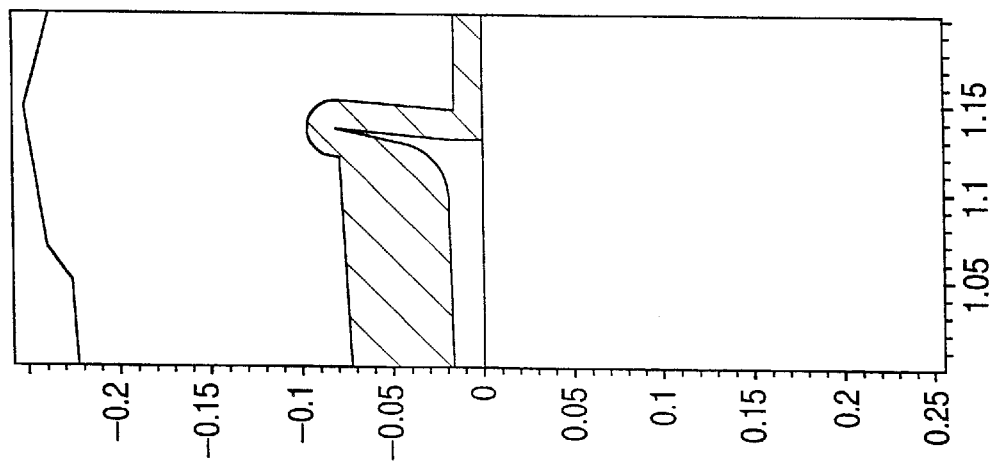

FIGS. 3(a–c) show the effect of adjusting the anisotropic nature of the etching step used to define the outer sidewalls 219 of the polysilicon which form the floating gate. By varying parameters of the etching process, such as the composition of the gases used during the etching process, the chemistry of the etcher, the pressure used during the etching process, the DC bias of the cathode for the etcher and the power of the etcher, the angle of the outer sidewall 219 of the floating gate can varied thereby controlling the shape of the tip of the floating gate. FIG. 3(a) shows a cut away view of one of the tips of a floating gate, where the etching process was such that the upper portion of the tip was etched to a greater degree than the lower portion of the tip. Thus, the outer sidewall of the floating gate is tilted slightly inward. FIG. 3(b) shows a cut away view of one of the tips of a floating gate, where the etching process was such that the upper portion of the tip was etched to a the same degree as the lower portion of the tip. Thus, the outer sidewall of the floating gate is vertical relative to the substrate. FIG. 3(c) shows a cut away view of one of the tips of a floating gate, where the etching process was such that the lower portion of the tip was etched to a greater degree than the upper portion of the tip. Thus, the outer sidewall of the floating gate is tilted slightly outward.

FIGS. 3(d–f) show the effect of adjusting the etching step used to create the trench in the polysilicon which forms the floating gate. By varying parameters of the etching process, such as the composition of the gases used during the etching process, the chemistry of the etcher, the pressure used during the etching process, the DC bias of the cathode for the etcher and the power of the etcher, the angle of the inner sidewall 210 of the floating gate can varied thereby controlling the shape of the tip of the floating gate.

The importance of being able to control the shape of the tip of the floating gate results from the fact that the flow electrons from the tip of the floating gate to control gate during the erase mode is related to the strength of the electric field at the tip of the floating gate. During the erase mode it is beneficial to have the electrons move from the tip to the control gate quickly and with a relatively low voltage being applied to the control gate. The effective electric field is proportional to the electric field at the tip, divided by the radius of curvature of the tip. The larger the effective electric field the more quickly the electrons tunnel through the oxide to the control gate via Fowler-Nordheim tunneling. Thus, it can be advantageous to use the etching process for creating the trench and the outer sidewalls of the floating gate to minimize the radius of the tip.

Although only specific methods and embodiments of the present invention are shown and described herein, the invention is not to be limited by these methods and embodiments. Rather, the scope of the invention is to be defined by these descriptions taken together with the attached claims and their equivalents.

What is claimed is:

1. A method of forming a semiconductor memory cell device, said method comprising:

depositing an insulating layer on a substrate;

depositing a first layer of conductive material on the insulating layer, such that all of a bottom the first layer of conductive material is on the insulating layer;

forming a trench in said first layer;

forming an oxide layer in said trench;

etching the first layer to form a floating gate having a tip, wherein the floating gate has an outer sidewall which formed by the etching of the first layer, wherein the etching of first layer is controlled such that the outer sidewall of the floating gate is not perpendicular to the substrate;

forming a layer of tunneling oxide over said floating gate;

depositing a second layer of conductive material over said floating gate; and etching the second layer to form a control gate.

2. The method of claim 1 wherein the etching the first layer to form said floating gate further comprises:

using the oxide layer in said trench as a mask when etching the first layer to form a floating gate.

3. The method of claim 1 wherein the creating of the trench comprises:

forming a mask over the first layer; and etching the first layer to define an inner sidewall of said trench.

4. The method of claim 3 wherein the etching of the first layer to define the inner sidewall of said trench includes controlling the etching process to effect the shape of the tip of the floating gate.

5. The method of claim 1 wherein the forming of the oxide in the shallow trench comprises:

forming a thermal oxide layer in said trench; and using a deposition process to deposit an second oxide layer over said thermal oxide layer.

6. The method of claim 1 wherein the conductive material of the first layer is polysilicon.

7. The method of claim 1 wherein the conductive material of the second layer is polysilicon.

8. A method of forming a semiconductor memory cell device, said method comprising:

depositing an insulating layer on a substrate;

depositing a first layer of conductive material on the insulating layer, such that all of a bottom the first layer of conductive material is on the insulating layer;

etching a trench in said first layer;

forming a thermal oxide layer in said trench;

depositing a second oxide layer over the thermal oxide layer;

etching the first layer to form a floating gate having a tip and an outer sidewall, wherein the second oxide layer in said trench is used as a mask during this etching step, and, wherein the etching of the first layer is controlled such that the outer sidewall of the floating gate is not perpendicular to the substrate;

forming a layer of tunneling oxide over said the floating gate;

depositing a second layer of conductive material over the tunneling oxide;

etching the second layer of conductive material to form a control gate;

implanting ions in the substrate to form a drain region; and implanting ions in the substrate to from a source region.

\* \* \* \* \*

UNITED STATES PATENT AND TRADEMARK OFFICE
CERTIFICATE OF CORRECTION

PATENT NO.    : 6,586,302 B1
DATED         : July 1, 2003
INVENTOR(S)   : Peter J. Hopper et al.

It is certified that error appears in the above-identified patent and that said Letters Patent is hereby corrected as shown below:

Column 6,
Line 31, change "such that all a bottom the" to -- such that all of a bottom of the --.
Lines 37-38, change "an outer sidewall which formed" to -- an outer sidewall which is formed --.
Line 64, change "to deposit an second" to -- to deposit a second --.

Column 7,
Line 6, change "all of a bottom the" to -- all of a bottom of the --.

Column 8,
Line 4, change "over said the floating" to -- over the floating --.

Signed and Sealed this

Seventh Day of October, 2003

JAMES E. ROGAN
*Director of the United States Patent and Trademark Office*